(12) United States Patent
Engelhardt et al.

(10) Patent No.: US 9,006,109 B2
(45) Date of Patent: Apr. 14, 2015

(54) SEMICONDUCTOR DEVICES AND METHODS FOR MANUFACTURING SEMICONDUCTOR DEVICES

(71) Applicant: Infineon Technologies AG, Neubiberg (DE)

(72) Inventors: Manfred Engelhardt, Villach-Landskron (AT); Martin Zgaga, Rosegg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/851,691

(22) Filed: Mar. 27, 2013

(65) Prior Publication Data

US 2014/0291779 A1    Oct. 2, 2014

(51) Int. Cl.
*H01L 21/311* (2006.01)
*B81C 1/00* (2006.01)
*B81B 3/00* (2006.01)

(52) U.S. Cl.
CPC ........... *B81C 1/00531* (2013.01); *B81B 3/0051* (2013.01)

(58) Field of Classification Search
USPC .................................................. 438/689, 703
See application file for complete search history.

(56) References Cited

U.S. PATENT DOCUMENTS

2014/0015548 A1*   1/2014   Naughton et al. ............ 324/658

* cited by examiner

*Primary Examiner* — Long Pham
(74) *Attorney, Agent, or Firm* — Murphy, Bilak & Homiller, PLLC (57) ABSTRACT

A method includes a step of performing a time multiplexed etching process, wherein the last etching step of the time multiplexed etching process is of a first time duration. After performing the time multiplexed etching process, an etching step having a second time duration is performed, wherein the second time duration is greater than the first time duration.

6 Claims, 7 Drawing Sheets

Applying a pulsed radio frequency bias signal to a chuck, wherein a pulse of the pulsed radio frequency bias signal has a first time duration ~3

Applying a constant radio frequency bias signal to the chuck, the constant radio frequency bias signal having a second time duration, wherein the second time duration is greater than the first time duration ~4

SEMICONDUCTOR DEVICES AND METHODS FOR MANUFACTURING SEMICONDUCTOR DEVICES

TECHNICAL FIELD

This invention relates to semiconductor devices, and methods for manufacturing semiconductor devices.

BACKGROUND

Semiconductor devices may include micro-mechanical structures that may be used for sensing physical signals. During a sensing process a micro-mechanical structure may be moved with respect to other components of the semiconductor device. It may be desirable to improve the performance and the quality of semiconductor devices. In particular, it may be desirable to avoid damage of micro-mechanical structures included in the semiconductor devices.

SUMMARY

According to an embodiment of a method, the method comprises: performing a time multiplexed etching process, wherein a last etching step of the time multiplexed etching process is of a first time duration; and after performing the time multiplexed etching process, performing an etching step of a second time duration, wherein the second time duration is greater than the first time duration.

According to another embodiment of a method, the method comprises applying a pulsed radio frequency bias signal to a chuck, wherein a pulse of the pulsed radio frequency bias signal is of a first time duration; and applying a constant radio frequency bias signal to the chuck, wherein the constant radio frequency bias signal comprises a second time duration, wherein the second time duration is greater than the first time duration.

According to an embodiment of a semiconductor device, the semiconductor device comprises a micro-mechanical structure and a semiconductor material arranged over the micro-mechanical structure. A side surface of the semiconductor material comprises a first region and a second region. The first region comprises an undulation. The second region is a peripheral region of the side surface and decreases towards the micro-mechanical structure.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, which form a part hereof, and in which is shown by way of illustration specific aspects in which the invention may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in noway limiting. It is understood that other aspects may be utilized and structural or logical changes may be made without departing from the scope of the present invention. Hence, the following detailed description is not to be taken in a limiting sense, and the scope of the present invention is defined by the appended claims.

It is understood that the features of the various exemplary aspects described herein may be combined with each other, unless specifically noted otherwise.

As employed in this specification, the terms "coupled" and/or "electrically coupled" are not meant to mean that the elements must be directly coupled together. Intervening elements may be provided between the "coupled" or "electrically coupled" elements.

Semiconductor devices in accordance with the disclosure may include micro-electro mechanical systems (MEMS). A MEMS may include one or multiple micro-mechanical structures, such as at least one of a bridge, a membrane, a cantilever, a tongue structure, etc. For example, a MEMS may be configured to operate as a microphone or a loudspeaker. In another example, a MEMS may be configured to operate as a sensor. A sensor may be configured to sense a physical variable, such as for example pressure, temperature, magnetic field, humidity etc. Examples of sensors are pressure sensors, tire pressure sensors, gas sensors, humidity sensors, etc.

For example, a MEMS may be integrated in a semiconductor chip. In addition, the semiconductor devices in accordance with the disclosure may include one or multiple additional semiconductor chips which do not necessarily include sensors. Semiconductor chips may be of different types, may be manufactured by different technologies, and may include for example integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Semiconductor chips in which micro-mechanical structures are embedded generally may include electronic circuits that may serve for processing signals generated by the micro-mechanical structures.

The semiconductor devices in accordance with the disclosure need not be manufactured from specific semiconductor material, for example Si, SiC, SiGe, GaAs, etc., and furthermore, may contain inorganic and/or organic materials that are not semiconductors, such as for example discrete passives, insulators, plastics and/or metals. Moreover, the semiconductor devices may be packaged or unpackaged.

Figure 1:
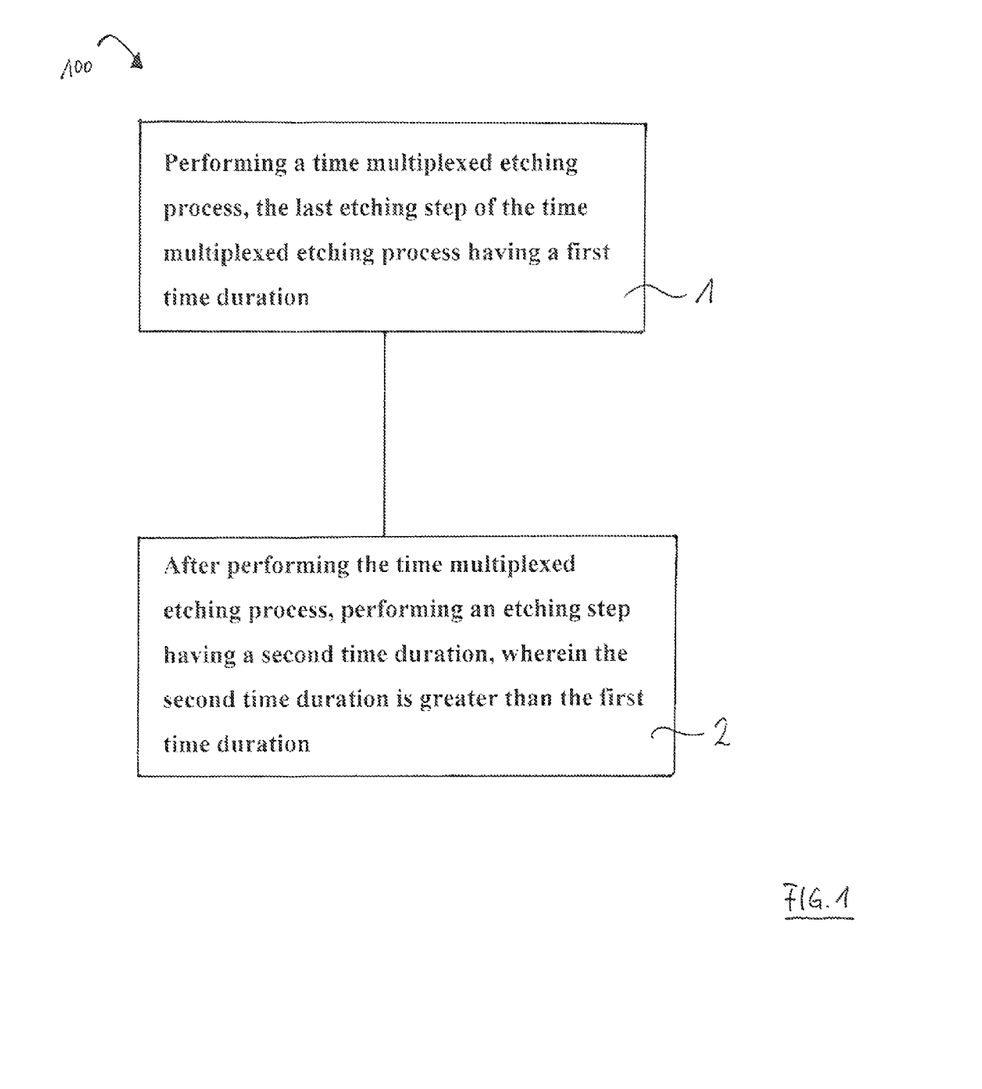
FIG. 1 is a block diagram of a method according to an embodiment.

FIG. 1 is a block diagram of a method 100 according to an embodiment, including method steps 1 and 2. At method step 1, a time multiplexed etching process is performed, wherein the last etching step of the time multiplexed etching process has a first time duration. At method step 2, after performing the time multiplexed etching process, an etching step having a second time duration is performed. The second time duration is greater than the first time duration. It is noted that a more detailed method similar to method 100 is described in connection with FIGS. 5A to 5G. It is understood that the method 100 may include further method steps. For example, the method 100 may include one or multiple method steps described in connection with the method of FIGS. 5A to 5G.

Figure 2:
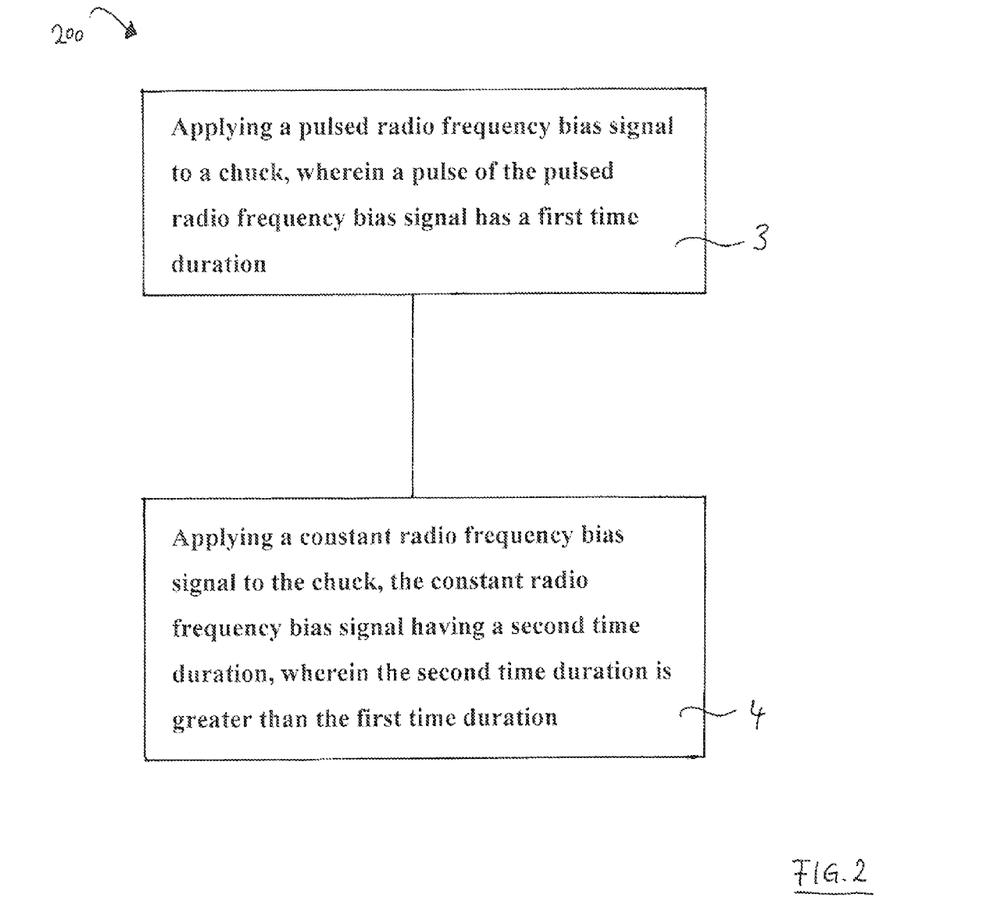
FIG. 2 is a block diagram of a method according to another embodiment.

FIG. 2 is a block diagram of a method 200 according to another embodiment, including method steps 3 and 4. At method step 3, a pulsed radio frequency bias signal is applied to a chuck, wherein a pulse of the pulsed radio frequency bias signal has a first time duration. At method step 4, a constant radio frequency bias signal is applied to the chuck, wherein the constant radio frequency bias signal has a second time duration. The second time duration is greater than the first time duration. It is noted that a more detailed method similar to method 100 is described in connection with FIGS. 5A to 5G. It is understood that the method 200 may include further method steps. For example, the method 200 may include one or more steps described in connection with the method of FIGS. 5A to 5G.

It is noted that the method 200 may particularly be read in connection with the method 100 of FIG. 1. For example, applying the pulsed radio frequency bias signal to the chuck according to method step 3 may result in the time multiplexed etching process of method step 1. In addition, applying the constant radio frequency bias signal to the chuck according to method step 4 may result in the etching step having the second time duration of method step 2. In this regard, the first and second time duration of method 200 may particularly correspond to the first and second time duration of method 100, respectively.

Figure 3:
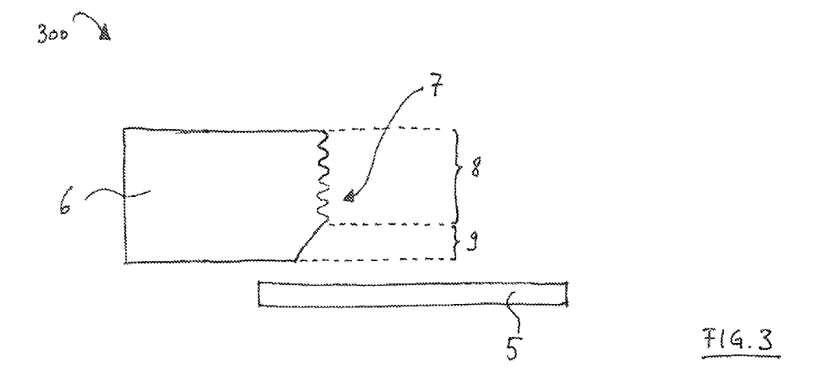
FIG. 3 schematically illustrates a cross-sectional view of a semiconductor device according to an embodiment.

FIG. 3 schematically illustrates a cross-sectional view of a semiconductor device 300 according to an embodiment. The semiconductor device 300 includes a micro-mechanical structure 5. The micro-mechanical structure 5 may be connected to other components of the semiconductor device 300 which are not illustrated for the sake of simplicity. The semiconductor device 300 further includes a semiconductor material 6 arranged over the micro-mechanical structure 5. A side surface 7 of the semiconductor material 6 includes a first region 8 and a second region 9. The first region 8 includes an undulation (or wave form or scallop form). The second region 9 is a peripheral region of the side surface 7 and decreases (or declines) in a direction towards the micro-mechanical structure 5. It is noted that a more detailed semiconductor device similar to the device 300 as well as a method for manufacturing a similar semiconductor device is described in connection with FIGS. 5A to 5G.

Figure 4:
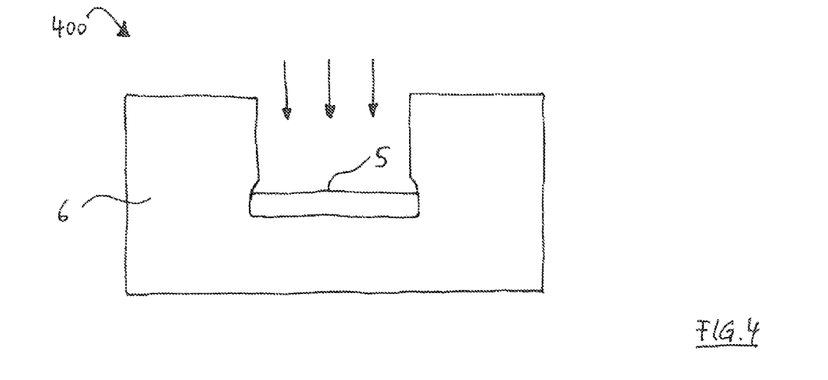
FIG. 4 schematically illustrates a cross-sectional view of a semiconductor device according to another embodiment.

FIG. 4 schematically illustrates a cross-sectional view of a semiconductor device 400 according to another embodiment. The semiconductor device 400 may include a semiconductor material 6, for example in the form of a semiconductor chip. The semiconductor material 6 may have an upper main surface including an aperture (or trench or groove or cavity) which may be delimited by side surfaces of the semiconductor material 6. The edge of the aperture may have an arbitrary geometric form depending on a respective usage of the semiconductor device 400. For example, the edge of the aperture may be rectangular, circular, etc. The semiconductor device 400 may further include a micro-mechanical structure 5 that may be arranged in the aperture. For example, the micro-mechanical structure 5 may be used for sensing a physical signal (see arrows) that may enter the aperture and may move (or deflect) the micro-mechanical structure 5. An action of the micro-mechanical structure 5 may generate a measuring signal indicative of the physical signal. For example, the measuring signal may be forwarded to a further semiconductor chip (not illustrated) that may be configured to evaluate and/or process the measuring signal.

It is understood that the semiconductor device 400 may include additional components which are not illustrated for the sake of simplicity. For example, the semiconductor device 400 may include one or more electrical contacts such that an electrical connection to other components may be established. Such electrical connections may e.g. be established by bond wires, contact pads, solder balls, etc. The semiconductor device 400 may further include an encapsulation (or molding) material that may at least partly encapsulate the semiconductor device 400. That is, the semiconductor device 400 may be packaged or unpackaged. In addition, the semiconductor device 400 may include an epoxy material or glob top material that may be arranged over the micro-mechanical structure 5 and may be configured to protect the micro-mechanical structure 5 from dirt, moisture, physical damage, etc. It is understood that a viscosity of such protective material may be chosen such that an appropriate measurement of the physical signal remains possible.

FIGS. 5A to 5G schematically illustrate a cross-sectional view of a method for manufacturing a semiconductor device 500 (see FIG. 5G) according to an embodiment. The semiconductor device 500 may be seen as an implementation of the semiconductor devices 300 and 400 of FIGS. 3 and 4. Details of the semiconductor device 500 may thus be likewise applied to each of the semiconductor devices 300 and 400 previously described herein. In addition, the method illustrated in FIGS. 5A to 5G may be seen as an implementation of the methods of FIGS. 1 and 2. Details of the method that are described below may therefore be likewise applied to each of methods 100 and 200 previously described herein.

Figure 5A:
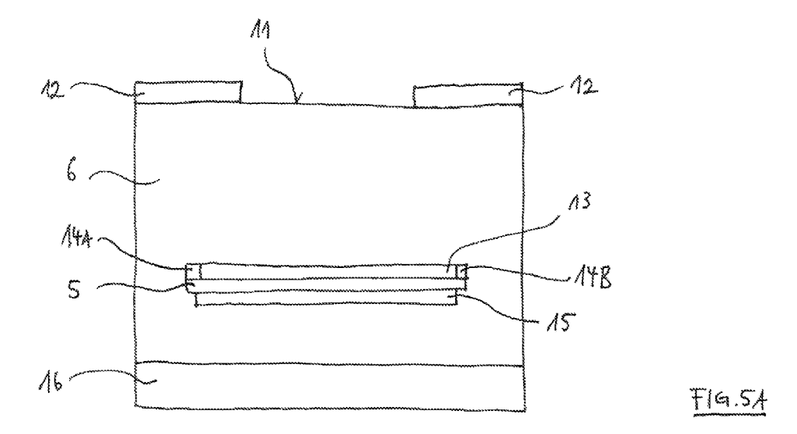
FIGS. 5A to 5G schematically illustrate a cross-sectional view of a method for manufacturing a semiconductor device according to an embodiment.

In FIG. 5A, a semiconductor device that is to be further processed may be provided. It is noted that the described method may include additional method steps that may have been carried out before providing the semiconductor device of FIG. 5A. For example, any suitable process may have been performed in order to manufacture one or multiple elements described in the following.

The semiconductor device of FIG. 5A may include a semiconductor material 6 having a main surface 11 over which a mask layer 12 may be arranged. The mask layer 12 may be fabricated of or may include an organic material (e.g. a photoresist, an imide, etc.) or an inorganic material (e.g. $SiO_2$, etc.), or both. The mask layer 12 may have the function of an etching mask, wherein the shape of the mask layer 12 may define the shape of an aperture that is to be subsequently etched into the semiconductor material 6. In this regard, an etch rate of the mask layer 12 may be smaller than an etch rate of the semiconductor material 6 during the subsequently performed etching processes. Here, an etch rate of a material may be defined as the difference between a thickness of the material before the etching process and a thickness of the material after the etching process divided by an etch time.

A material layer 13 may be arranged under the main surface 11 of the semiconductor material 6. The material layer 13 may be configured to act as an etch stopping layer during etching steps subsequently performed. An etch rate of the material layer 13 thus may be particularly smaller that an etch rate of the semiconductor material 6 during the performed etching steps. A micro-mechanical structure 5 may be arranged under the material layer 13. For example, the micromechanical structure 5 may correspond to a membrane of a microphone or a loudspeaker. In general, the micro-mechanical structure 5 may correspond to or may include at least one of a bridge, a membrane, a cantilever, a tongue structure, etc. Side parts (or ends) of the micro-mechanical structure 5 may be suspended by suspension elements 14A, 14B that may be arranged between the micro-mechanical structure 5 and the semiconductor material 6. The semiconductor device may further include a cavity (or hollow space) 15 that may be arranged under the micro-mechanical structure 5. The semiconductor device may be arranged on a chuck 16 that may be configured to mount the semiconductor device for processing. The chuck 16 may include an electrode electrically connected to a power (or voltage) supply (not illustrated). It is noted that the terms "chuck" and "chuck electrode" may be used synonymously in the following.

While performing method steps described in the following, the semiconductor device of FIG. 5A may be arranged in a plasma chamber (not illustrated). The plasma chamber may include circuitry for monitoring and adjusting various power signals (or voltage signals) that may be applied to the chuck 16. For example, it may be possible to apply a constant radio frequency bias signal to the chuck 16 which may also be referred to as "radio frequency chuck power". The radio frequency bias signal may have an arbitrary radio frequency in a range from e.g. about 1 MHz to about 50 MHz, for example a frequency of about 13 MHz, and more particular a frequency of about 13.56 MHz. The constant radio frequency bias signal may be divided into parts (or bursts) that may occur with a frequency from about e.g. 50 kHz to about e.g. 150 kHz, in particular of about e.g. 100 kHz. Even though the radio frequency bias signal is thus not constant in a strict sense, it may be referred to herein as a constant radio frequency bias signal. In particular, the constant radio frequency bias signal may be configured to generate a DC voltage in the plasma that may be configured to accelerate plasma particles towards the semiconductor material 6 as will be described later.

In addition, it may be possible to apply a pulsed radio frequency bias signal to the chuck 16. Here, the pulsed radio frequency bias signal may be alternately active and inactive for predetermined time intervals, respectively. For example, the pulsed radio frequency bias signal may be in an active phase for time intervals from about 0.5 seconds to about 10 seconds, or more particular from about 1 second to about 5 seconds, or even more particular from about 1 second to about 3 seconds. In between such active time intervals, the pulsed radio frequency bias signal may be in an inactive phase during time intervals of a similar time duration. In particular, a frequency of the pulsed radio frequency bias signal may depend on a depth of an aperture that is to be etched as well as a number of desired etching step(s) that are to be performed for etching the aperture.

Figure 5B:
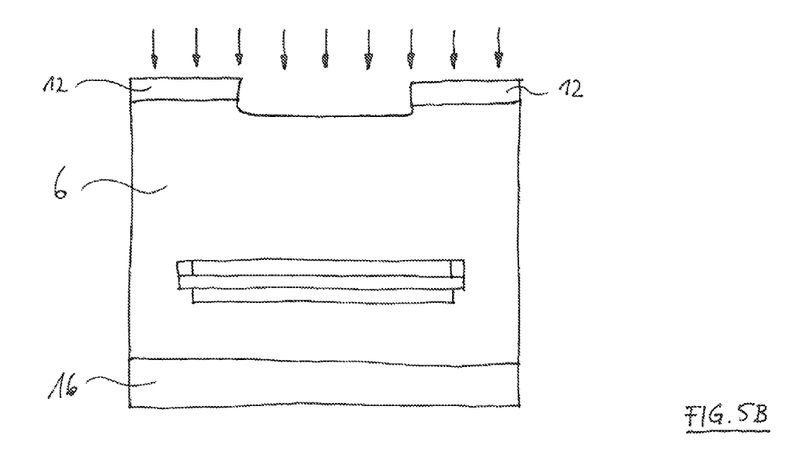

In FIG. 5B, the semiconductor material 6 that may be partly protected by the mask layer 12 may be etched by a dry etching process, for example a plasma etching process. The mask layer 12 may leave selected areas of the semiconductor material 6 exposed such that the semiconductor material 6 may be processed using a reactive-gas plasma that may etch the semiconductor material 6 at the exposed locations. Plasma etching may be performed by ionizing a gas mix inside the plasma chamber to obtain ions that may react with the target material. An ionization of employed gases may be performed using a radio frequency excitation, for example by applying a radio frequency power to an inductive coil. A used plasma source (or etch species) may include charged (ions) and/or neutral (atoms and radicals) particles. It is noted that the term "plasma etching" as used herein may refer to any suitable etching process employing a plasma, for example Reactive Ion Etching, Deep Reactive Ion Etching, Ion Beam Etching, etc. For the specific case of a silicon semiconductor material to be etched, the etching may be based on e.g. a sulfur hexafluoride ($SF_6$) plasma etch chemistry.

The pulsed radio frequency bias signal may be applied to the chuck 16, wherein FIG. 5B illustrates a first phase in which the pulsed radio frequency bias signal may be in an active phase of a predetermined time duration, for example for about 0.5 seconds to about 10 seconds, or more particular for about 1 second to about 5 seconds, or even more particular for about 1 second to about 3 seconds (see above). The applied radio frequency chuck power may induce a self-DC bias on the chuck 16 which may accelerate the particles of the plasma towards the semiconductor material 6 such that the particles may attack the semiconductor material 6 in a substantially vertical direction (see arrows). The plasma may generate volatile etch products from chemical reactions between the elements of the semiconductor material 6 to be etched and the reactive species generated by the plasma. If a high etch rate of the semiconductor material 6 is desirable, a high radio frequency chuck power may be applied to the chuck 16.

Figure 5C:
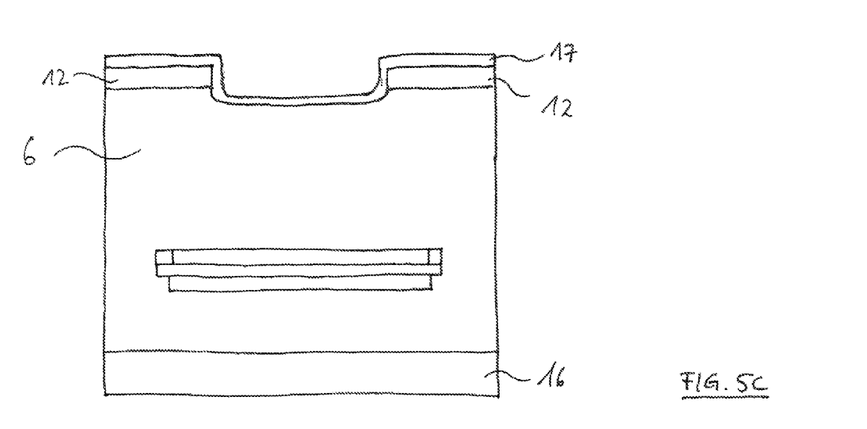

In FIG. 5C, the pulsed radio frequency bias signal may be in an inactive phase of a predetermined time duration, for example for about 0.5 seconds to about 10 seconds, or more particular for about 1 second to about 5 seconds, or even more particular for about 1 second to about 3 seconds (see above). During such a second (inactive) phase, a passivation layer 17 may be deposited over the semiconductor material 6, thereby covering the side walls and the bottom of the groove that has been etched during the first (active) phase of FIG. 5B. In particular, the passivation layer 17 may be configured to protect the side walls of the groove during an etching process that is subsequently performed. For example, the passivation layer 17 may correspond to or may include a polymer. For the specific case of a silicon semiconductor material to be etched, the deposition of the passivation layer 17 may e.g. be based on an octafluorocyclobutane ($C_4F_8$) polymer deposition chemistry.

Figure 5D:
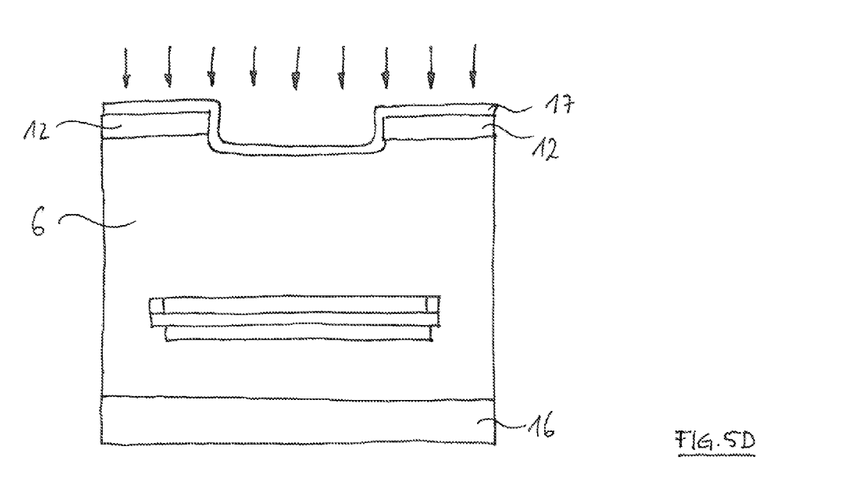

In FIG. 5D, a further etching step similar to the etching step of FIG. 5B may be performed. Comments made in connection with FIG. 5B thus may also hold true for FIG. 5D. At first, the passivation layer 17 may protect the entire semiconductor material 6 surface from further chemical attack and may prevent further etching. However, during the subsequent etching phase, the directional particles bombarding the semiconductor material 6 may attack the passivation layer 17 at the bottom of the groove, but not along the side walls. They may collide with the passivation layer 17 and sputter off the passivation layer 17, exposing the semiconductor material 6 to the chemical etchant such that further semiconductor material 6 may be etched.

The etching step of the first phase (see FIGS. 5B and 5D) and the deposition step of the second phase (see FIG. 5C) may be alternately repeated multiple times resulting in multiple etching steps taking place at the bottom of the groove. Here, alternating the first and second phases yields a pulsation of the pulsed radio frequency bias signal. The periodically alternating procedure may be referred to as "time multiplexed etching process" or "time modulated etching process" or "time pulsed etching process". An example for a time multiplexed etching process is the Bosch process. An application of a time multiplexed etching process may result in an undulation (or wave form or wave shape or scallops shape) of the side walls of the etched trench. Each undulation or wave may be the result of one etching step and a subsequent deposition step or vice-versa. For example, the method steps of the first and second phase may be repeated e.g. about 10 times to about 100 times, wherein an amplitude u of an undulation may lie in a range from about 20 nanometers to about 500 nanometers. It is to be noted that the amplitude u of the undulations as well as the depth of the etched groove may depend on the number of repetitions of the method steps of the first and second phase. Furthermore, the amplitude u of the undulations may depend on the time durations of the pulses of the pulsed radio frequency bias signal applied to the chuck 16. In particular, the amplitude u of the undulations may increase with increased time durations of the first and second phase, respectively.

Figure 5E:
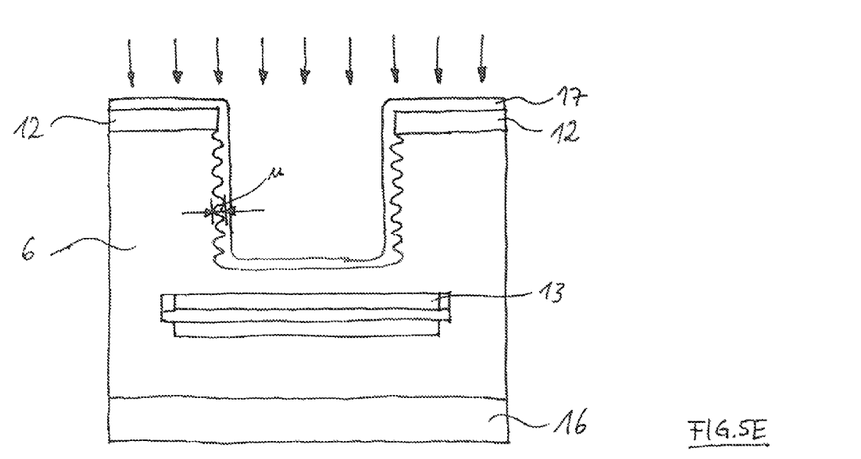

In FIG. 5E, the side walls of the trench include the described undulation u resulting from the previously performed time multiplexed etching process. The last deposition step of the time multiplexed etching process may have been performed such that a passivation layer 17 is again deposited over the side walls and the bottom of the trench. The periodically pulsed radio frequency bias signal that has been applied to the chuck 16 during the time-multiplexed etching process may be now switched to a constant radio frequency bias signal applied to the chuck 16. In other words, the radio frequency bias signal applied to the chuck 16 holding the semiconductor material 6 may be switched from a pulsed mode to a steady-state (constant) mode before the semiconductor material 6 is completely etched and the underlying material layer 13 is exposed. In practice, a number of desired iterations of the time multiplexed etching steps may be predetermined depending on the desired depth of the trench that is to be etched. The time multiplexed etching process may then be started and after the number of predetermined etching steps have been performed, the pulsed radio frequency bias signal may be switched to the constant radio frequency bias signal.

Figure 5F:
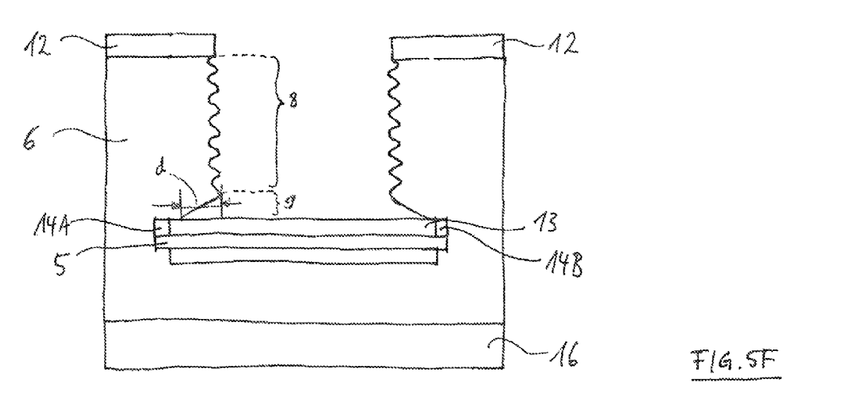

Due to switching to the steady-state mode of the constant radio frequency bias signal applied to the chuck 16, a continuous and steady etching step may be performed that may expose the material layer 13. Note that a following step of depositing a further passivation layer is omitted. The etching step performed in FIG. 5E may again be a dry etching step, in particular a plasma etching step. During the steady state etching, the passivation layer 17 may be etched and removed at the bottom of the trench until the material layer 13 is exposed. Here, the material layer 13 may be exposed at first in the middle of the bottom of the trench and then may continue to become exposed in a direction to the outer regions of the bottom of the trench. FIG. 5F illustrates the semiconductor device after performing the steady-state etching process. Due to the steady-state etching based on the constant radio frequency bias signal, a second peripheral region 9 may be manufactured on the side surfaces of the trench wherein the second peripheral region 9 may decrease (or decline) in a direction towards the material layer 13 and the micro-mechanical structure 5.

The time duration of the last pulse of the pulsed radio frequency bias signal during the time multiplexed etching process may be smaller than the time duration of applying the constant radio frequency bias signal. In other words, the time duration of the last etching step of the time multiplexed etching process may be smaller than the time duration of the etching step performed during the application of the constant radio frequency bias signal. Hence, a decrease d of the second region 9 may be greater than the last undulation u of the first region 8. In one example, the time duration of the steady state etching process may even be greater than each of the respective time durations of the etching steps during the time multiplexed etching process. In this case, the decrease d of the second region 9 may be greater than each undulation of the first region 8. For example, the time duration of the steady-state etching process associated with the constant radio frequency bias signal may particularly be greater than or equal to 3 seconds, 4 seconds, 5 seconds, 6 seconds, or 7 seconds. In particular, the time duration of the steady-state etching process may be chosen such that the suspension elements 14A, 14B are not damaged by the etching process.

Figure 5G:
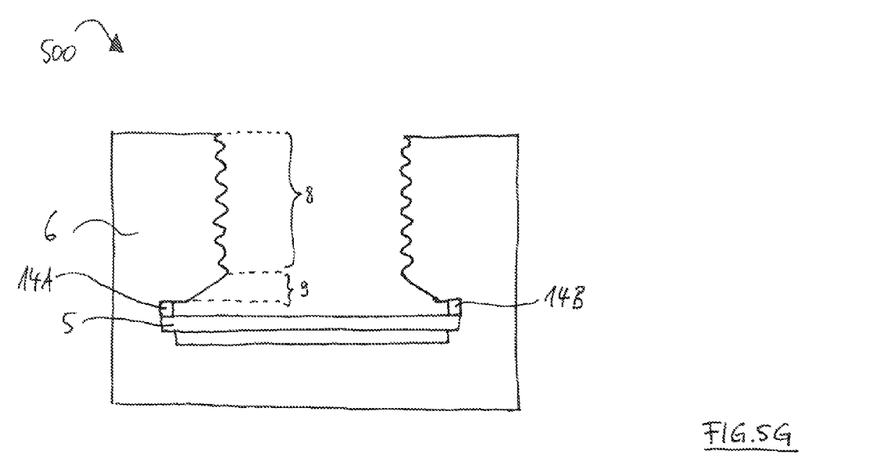

In FIG. 5G, the mask layer 12 and the material layer 13 may be removed by applying a suitable technique. In addition, the semiconductor device may be removed from the chuck 16. For example, the material layer 13 may be removed by applying at least one of an etching step and an asking step. After removing the material layer 13, an aperture delimited by the side walls of the semiconductor material 6 may have been formed. Here, the side surfaces of the aperture may be arranged substantially perpendicular to the micro-mechanical structure 5. The micro-mechanical structure 5 may be arranged in the manufactured aperture and may be suspended between the suspension elements 14A, 14B. The micro-mechanical structure 5 may be movable in a direction substantially perpendicular to the side surfaces of the trench, for example in response to a physical signal that is to be measured.

Due to the last etching step performed after turning off the time multiplexed etching process, the second region 9 may decrease throughout the whole second region 9, i.e. the second region 9 may monotonically (or strictly monotonically) decrease over its whole extension. The second region 9 may correspond to or may include at least one of a plane and a convex surface. The side surfaces of the semiconductor material 6 may have a re-entrant profile at the bottom of the aperture.

The method of FIGS. 5A to 5G may be compared to a pure time multiplexed etching process which does not include a switching to the steady-state in accordance with the disclosure. When performing a pure time multiplexed etching process, sharp edges may occur at the bottom of the etched aperture. In contrast to this, due to switching to the steady-state mode in accordance with the disclosure, the smooth second region 9 may be particularly free of acute-angled sections and a formation of a sharp edge at the bottom of the aperture may be avoided. Hence, no physical contact between the micro-mechanical structure 5 and a sharp edge will occur during an action of the micro-mechanical structure 5 such that damage or breakage of the micro-mechanical structure 5 may be avoided.

It is understood that the described method of FIGS. 5A to 5G may include further method steps. For example, the semiconductor device 500 may be packaged, or a protective layer may be arranged over the micro-mechanical structure 5, or the semiconductor device 500 may be connected to one or more components, etc.

While a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific aspects shown and described without departing from the scope of the present invention. This application is intended to cover any adaptations or variations of the specific aspects discussed herein. Therefore, it is intended that this invention be limited only by the claims and the equivalents thereof.

What is claimed is:

1. A method, comprising:
    performing a time multiplexed etching process, wherein a last etching step of the time multiplexed etching process is of a first time duration; and
    after performing the time multiplexed etching process, performing an etching step of a second time duration, wherein the second time duration is greater than the first time duration,
    wherein the time multiplexed etching process comprises:
        performing an etching step comprising etching a surface of a first material;
        performing a depositing step comprising depositing a second material over the surface of the first material; and
        alternately repeating the etching step and the depositing step.

2. The method of claim 1, wherein the first material comprises a semiconductor material and the second material comprises a polymer.

3. The method of claim 1, further comprising:
    exposing a third material arranged under the first material, wherein during at least one of the time multiplexed etching process and the etching step performed after the time multiplexed etching process an etch rate of the third material is smaller than an etch rate of the first material.

4. The method of claim 3, further comprising:
    removing the third material by at least one of an etching step and an ashing step.

5. A method, comprising:
    performing a time multiplexed etching process, wherein a last etching step of the time multiplexed etching process is of a first time duration; and
    after performing the time multiplexed etching process, performing an etching step of a second time duration, wherein the second time duration is greater than the first time duration,
    wherein at least one of the time multiplexed etching process and the etching step performed after the time multiplexed etching process comprises a dry etching step.

6. A method, comprising:
    performing a time multiplexed etching process, wherein a last etching step of the time multiplexed etching process is of a first time duration; and
    after performing the time multiplexed etching process, performing an etching step of a second time duration, wherein the second time duration is greater than the first time duration,
    wherein the time multiplexed etching process comprises multiple etching steps, wherein each of the multiple etching steps of the time multiplexed etching process is of a respective time duration, wherein the second time duration is greater than each of the respective time durations.

* * * * *